(12) United States Patent
Cho et al.

(10) Patent No.: US 8,659,452 B2
(45) Date of Patent: Feb. 25, 2014

(54) DATA COMPRESSION DEVICES, OPERATING METHODS THEREOF, AND DATA PROCESSING APPARATUSES INCLUDING THE SAME

(75) Inventors: Kyoung Lae Cho, Yongin-si (KR); Chan Ho Yoon, Seoul (KR); Jun Jin Kong, Yongin-si (KR); Pil Sang Yoon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 82 days.

(21) Appl. No.: 13/353,984

(22) Filed: Jan. 19, 2012

(65) Prior Publication Data

US 2012/0182163 A1 Jul. 19, 2012

(30) Foreign Application Priority Data

Jan. 19, 2011 (KR) ........................ 10-2011-0005575

(51) Int. Cl.
*H03M 7/00* (2006.01)

(52) U.S. Cl.
USPC ................................ 341/107; 341/51; 341/87

(58) Field of Classification Search
USPC ........................................ 341/50–51, 87, 107
See application file for complete search history.

(56) References Cited

U.S. PATENT DOCUMENTS

| 5,467,087 | A | * | 11/1995 | Chu | ................................ | 341/51 |
| 6,195,024 | B1 | * | 2/2001 | Fallon | ............................. | 341/51 |
| 6,597,812 | B1 | * | 7/2003 | Fallon et al. | .................. | 382/232 |
| 2003/0030575 | A1 | * | 2/2003 | Frachtenberg et al. | ......... | 341/51 |
| 2006/0209615 | A1 | | 9/2006 | Iwatsu | | |

FOREIGN PATENT DOCUMENTS

| JP | 2000-032242 A | 1/2000 |
| JP | 2004-201309 A | 7/2004 |
| JP | 2004-208018 A | 7/2004 |

* cited by examiner

*Primary Examiner* — Khai M Nguyen
(74) *Attorney, Agent, or Firm* — Harness, Dickey & Pierce, P.L.C.

(57) ABSTRACT

A method of operating a data compression device includes analyzing data using an analyzer and generating a result of the analysis, while the data is buffered by an input buffer, and selectively compressing the buffered data according to the result of the analysis. A data compression device includes a data pattern analyzer configured to analyze data transmitted to an input buffer, and generate an analysis code based on the analysis of the data; and a data compression manager configured to selectively compress the data in the input buffer based on the analysis code.

18 Claims, 17 Drawing Sheets

FIG. 3

| Symbol | Frequency | Codeword |
|--------|-----------|----------|
| AA | 10 | 1011 |
| BB | 100 | 101 |
| CC | 1000 | 10 |
| DD | 2 | 10101 |
| EE | 5 | 10001 |
| FF | 50 | 110 |
| ⋮ | ⋮ | ⋮ |

DATA COMPRESSION DEVICES, OPERATING METHODS THEREOF, AND DATA PROCESSING APPARATUSES INCLUDING THE SAME

CROSS-REFERENCE TO RELATED APPLICATIONS

This application claims priority under 35 U.S.C. §119(a) to Korean Patent Application No. 10-2011-0005575 filed on Jan. 19, 2011, the disclosure of which is hereby incorporated by reference in its entirety.

BACKGROUND

1. Field

Example embodiments of inventive concepts relate to data compression technology, for example, data compression devices capable of analyzing data and determining whether to compress the data based on a result of the analysis, methods of operating data compression devices, methods for compressing data, and/or data processing apparatuses including a data compression devices.

2. Description of Conventional Art

Data compression refers to a technology to more efficiently store data in smaller storage spaces and actual applications of this technology. Conventional data compression includes an encoding and a decoding process. During an encoding process, the size of data is reduced. During a decoding process, encoded data is restored to an original data.

SUMMARY

At least one example embodiment provides a method of operating a data compression device. According to at least this example embodiment, the method includes: analyzing a pattern of data using a data pattern analyzer while the data is buffered in an input buffer; outputting a result of the analysis; and bypassing or compressing the buffered data according to the result of the analysis.

In one example, the analyzing of the pattern of the data may include: analyzing an indication bit included in a header of the data; and indicating whether to compress the data based on the analyzed indication bit.

In another example, the analyzing of the pattern of the data may include counting a frequency of each of a plurality of symbols included in the data. In this example, the result of the analysis may be a result of a comparison between a reference value and one of a maximum and minimum of the counted frequencies.

In yet another example, the analyzing of the pattern of the data may include: counting a frequency of each of a plurality of symbols included in the data; assigning a codeword to each of the plurality of symbols; and calculating a size of estimated data using the frequency of each of the plurality of symbols and a number of bits of the codeword assigned to each of the plurality of symbols. The result of the analysis may be the result of a comparison between a size of the estimated data and a size of a reference data.

In still another example, the analyzing of the pattern of the data may include: analyzing an indication bit included in a header of the data to determine whether to compress the data; and counting a frequency of each of a plurality of symbols included in the data based on a result of the analysis of the indication bit. In this example, the result of the analysis may be a result of a comparison between a reference value and any one of a maximum and minimum of the counted frequencies.

The bypassing or the compressing the buffered data may include storing the result of the analysis in a memory, and bypassing the buffered data or compressing the buffered data using a processor, according to the result of the analysis stored in the memory. The analysis of the pattern of the data may be completed before the buffered data is output.

At least one other example embodiment provides a data compression device. According to at least this example embodiment, the data compression device includes: an input buffer; a data pattern analyzer configured to analyze a pattern of data transmitted to the input buffer and output an analysis code; and a data compression manager configured to bypass the buffered data in the input buffer to a non-volatile memory device or compress the buffered data to generate compressed data and transmit the compressed data to the non-volatile memory device, according to the analysis code.

In one example, the data pattern analyzer may analyze an indication bit included in a header of the data to determine whether to compress the data, and output the analysis code based on the indication bit. The data pattern analyzer may count a frequency of each of a plurality of symbols included in the data and output a result of comparison between a reference value and one of a maximum and minimum of the counted frequencies, as the analysis code.

In another example, the data pattern analyzer may count a frequency of each of a plurality of symbols included in the data, assign a codeword to each of the plurality of symbols, and output a result of comparison between a size of a reference data and a size of estimated data, as the analysis code. The estimated data may be obtained using the frequency of each of the plurality of symbols and a number of bits of the codeword assigned to each of the plurality of symbols.

According to at least some example embodiments, the data pattern analyzer may include: a header analyzer configured to output a control signal according to an indication bit indicating whether to compress the data included in a header of the data; and an estimator that is enabled according to an activated control signal. The estimator is configured to count a frequency of each of a plurality of symbols included in the data, assign a codeword to each of the plurality of symbols, and output a result of comparison between a size of a reference data and a size of estimated data, as the analysis code.

According to at least some example embodiments, the data pattern analyzer may include a pattern analyzer configured to count a frequency of each of a plurality of symbols included in the data, and assign a codeword to each of the plurality of symbols. The data pattern analyzer may further include an estimator configured to receive a frequency of each of the symbols output from the pattern analyzer, and output a result of comparison between a size of a reference data and a size of estimated data, as the analysis code. The estimated data may be obtained based on the frequency of each of the plurality of symbols and a number of bits of the codeword assigned to each of the plurality of symbols.

The data compression manager may include: a memory configured to store the analysis code; a processor configured to compress the buffered data and output compressed data; and a selector configured to bypass the buffered data to the non-volatile memory device or transmit the buffered data to the processor, according to the analysis code stored in the memory.

The processor may sequentially compress respective symbols of the buffered data and output information indicative of a relationship between the symbols without compressing duplicated symbols within the buffered data.

At least one other example embodiment provides a data processing apparatus. According to at least this example embodiment, the data processing apparatus includes: a non-volatile memory device; and a data compression device configured to transmit bypassed data or compressed data to the non-volatile memory device. The data compression device includes: an input buffer; and a data pattern analyzer configured to analyze a pattern of data while the data is transmitted to the input buffer, and output an analysis code. The data processing apparatus further includes a data compression manager configured to output the buffered data as the bypassed data or compress the buffered data and output the compressed data, according to the analysis code The data processing apparatus may be a solid state drive (SSD), a smart card, a memory card, a smart phone, a tablet personal computer (PC), a personal digital assistant (PDA), MP3 or other music player device, or the like. The data compression device may be integrated in a memory controller configured to control the non-volatile memory.

At least one other example embodiment provides a method of compressing data, comprising: analyzing, by a data pattern analyzer, the data to determine whether to compress the data; generating a result of the analysis, at least one of the analyzing and the generating being performed while the data is buffered in an input buffer; and selectively compressing the data in the input buffer based on the result of the analysis.

At least one other example embodiment provides a method of operating a data compression device, comprising: intercepting data transmitted to an input buffer; analyzing a pattern of the intercepted data and outputting a result of the analysis; and outputting one of the buffered data in the input buffer and compressed data according to a result of the analysis, the compressed data being generated by compressing the buffered data.

The analysis the pattern of the data may be completed before the buffered data is output from the input buffer. When the data is n-bit data, where n is a natural number, the buffered data may be an integral times of the data.

According to at least some example embodiments, the analyzing the data may comprise: analyzing an indication bit included in a header of the data, the indication bit indicating whether to compress the data. The result of the analysis may be generated based on the analysis of the indication bit.

According to at least some example embodiments, the analyzing the data may comprise: counting a frequency of each of a plurality of symbols included in the data; and comparing a reference value with one of a maximum and minimum of the counted frequencies; wherein the result of the analysis is generated based on the comparison.

According to at least some example embodiments, the analyzing the data may comprise: counting a frequency of each of a plurality of symbols included in the data; assigning a codeword to each of the plurality of symbols; calculating an estimate of the size of compressed data based on the frequency of each of the plurality of symbols and a number of bits of the codeword assigned to each of the plurality of symbols; and comparing the estimated size of the compressed data with a reference value; wherein the result of the analysis is generated based on the comparison.

According to at least some example embodiments, the analyzing the data may comprise: analyzing an indication bit included in a header of the data, the indication bit indicating whether to compress the data; counting a frequency of each of a plurality of symbols included in the data based on the analysis of the indication bit; and comparing a reference value with one of a maximum and a minimum of the counted frequencies; wherein the result of the analysis is generated based on the comparison.

The selectively compressing the buffered data may comprise: storing the result of the analysis in a memory; and selectively compressing the buffered data using a processor based on the result of the analysis stored in the memory. The analyzing of the data may be completed before the buffered data is output.

At least one other example embodiment provides a data compression device comprising: a data pattern analyzer configured to analyze data transmitted to an input buffer, the data pattern analyzer being further configured to generate an analysis code based on the analysis; and a data compression manager configured to selectively compress the buffered data in the input buffer based on the analysis code.

At least one other example embodiment provides a data processing apparatus comprising: a non-volatile memory device; and a data compression device configured to selectively compress buffered data. The data compression device includes: an input buffer; a data pattern analyzer configured to analyze a pattern of the data and output an analysis code, at least one of the analyzing of the pattern and the outputting of the analysis code being performed while the data is transmitted to the input buffer; and a data compression manager configured to selectively compress the buffered data in the input buffer, according to the analysis code.

According to at least some example embodiments, the data pattern analyzer may be configured to analyze an indication bit included in a header of the data, and generate the analysis code based on the analysis of the indication bit. The indication bit may indicate whether to compress the data.

According to at least some example embodiments, the data pattern analyzer may be configured to count a frequency of each of a plurality of symbols included in the data, and generate the analysis code based on the comparison between a reference value and one of a maximum and a minimum of the counted frequencies.

According to at least some example embodiments, the data pattern analyzer may be configured to count a frequency of each of a plurality of symbols included in the data, assign a codeword to each of the plurality of symbols, and generate the analysis code based on a comparison between a size of a reference data and an estimated size of compressed data, the estimated size of the compressed data being calculated based on a frequency of each of the plurality of symbols and a number of bits of the codeword assigned to each of the plurality of symbols.

According to at least some example embodiments, the data pattern analyzer may comprise: a header analyzer configured to output a control signal based on an indication bit included in a header of the data, the indication bit indicating whether to compress the data; and an estimator configured to be selectively enabled in response to an activation control signal, the estimator being further configured to count a frequency of each of a plurality of symbols included in the data, assign a codeword to each of the plurality of symbols, and generate the analysis code based on a result of a comparison between a size of a reference data and an estimated size of the compressed data, the estimated size of the compressed data being calculated based on a frequency of each of the plurality of symbols and a number of bits of the codeword assigned to each of the plurality of symbols.

According to at least some example embodiments, the data pattern analyzer may comprise: a pattern analyzer configured to count a frequency of each of a plurality of symbols included in the data, and assign a codeword to each of the plurality of symbols; and an estimator configured to receive the frequency of the each of the symbols and the codeword assigned to the each of the plurality of symbols from the pattern analyzer, and configured to generate the analysis code based on a result of comparison between a size of a reference data and an estimated size of the compressed data, the estimated size of the compressed data being calculated based on the frequency of the each of the plurality of symbols and a number of bits of the codeword assigned to each of the plurality of symbols.

According to at least some example embodiments, the data compression manager may comprise: a memory configured to store the analysis code; a processor configured to compress the buffered data and output compressed data; and a selector configured to output the buffered data to one of the non-volatile memory device and the processor based on the analysis code stored in the memory.

At least one other example embodiment provides a method for compressing input data, comprising: selectively compressing, at a data compression device, data based on one of a pattern of the data and a value of an indication bit included in a header of the data, each of the pattern and the indication bit being indicative of whether the data is compressed data.

According to at least some example embodiments, the method may further comprise: determining whether the data includes header information; wherein the data is selectively compressed based on the indication bit if the data includes header information. The data may be selectively compressed based on the pattern of the data if the data does not include header information.

According to at least some example embodiments, the method may further comprise: counting a frequency of each symbol included in the data; comparing one of a maximum and minimum frequency from among the counted frequencies with a reference value; and wherein the selectively compressing step selectively compresses the data based on the comparison between the reference value and the maximum or minimum frequency.

According to at least some example embodiments, the method may further comprise: counting a frequency of each symbol included in the data; assigning a codeword to each of the symbols included in the data; estimating a size of compressed data based on the counted frequencies and a number of bits of each assigned codeword; comparing an estimated size of the compressed data with a reference value; and wherein the selectively compressing step selectively compresses the data based on the comparison between the estimated size of the compressed data and the reference value.

At least one other example embodiment provides a data compression device comprising: a data compression manager configured to selectively compress data based on one of a pattern of the data and a value of an indication bit included in a header of the data, each of the pattern and the indication bit being indicative of whether the data is compressed data.

According to at least some example embodiments, the data compression device may further comprise: a data pattern analyzer configured to determine whether the data includes header information; and wherein the data compression manager selectively compresses the data based on the indication bit if the data includes header information.

According to at least some example embodiments, the data compression manager may selectively compress the data based on the pattern of the data if the data does not include header information.

The data pattern analyzer may be further configured to count a frequency of each symbol included in the data, and compare one of a maximum and a minimum frequency from among the counted frequencies with a reference value. The data compression manager may selectively compress the data based on the comparison between the reference value and the maximum or minimum frequency.

The data pattern analyzer may be further configured to count a frequency of each symbol included in the data, assign a codeword to each of the symbols included in the data, estimate a size of compressed data based on the frequencies and a number of bits of each assigned codeword, and compare an estimated size of the compressed data with a reference value. The data compression manager may selectively compress the data based on the comparison between the estimated size of the compressed data and the reference value.

BRIEF DESCRIPTION OF THE DRAWINGS

Example embodiments of inventive concepts will become more clearly understood from the following detailed description taken in conjunction with the accompanying drawings in which:

FIG. 3 is a table for explaining example operation of the data pattern analyzer 20B of FIG. 2;

DETAILED DESCRIPTION

Figure 1A:
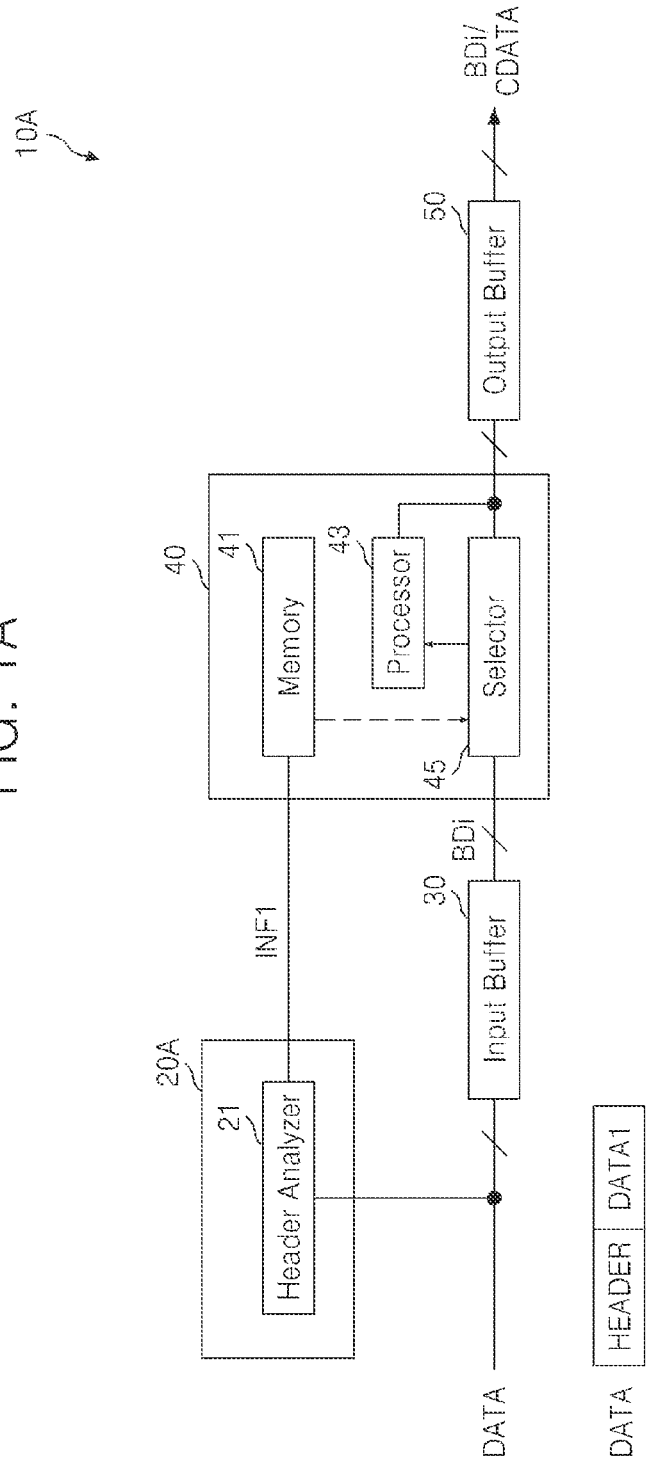
FIG. 1A is a block diagram of a data compression device according to an example embodiment of inventive concepts.

Example embodiments now will be described more fully hereinafter with reference to the accompanying drawings.

The example embodiments may, however, be embodied in many different forms and should not be construed as limited to the example embodiments set forth herein. Rather, these example embodiments are provided so that this disclosure will be thorough and complete. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of this disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In some alternative implementations, the functions/acts noted may occur out of the order noted in the figures. For example, two figures shown in succession may in fact be executed substantially concurrently or may sometimes be executed in the reverse order, depending upon the functionality/acts involved.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

In the following description, at least some example embodiments are described with reference to acts and symbolic representations of operations (e.g., in the form of flow charts, flow diagrams, data flow diagrams, process flow diagrams, partial process flow diagrams, structure diagrams, block diagrams, etc.), at least some of which may be implemented as program modules or functional processes including routines, programs, objects, components, data structures, etc., that perform particular tasks or implement particular abstract data types. These program modules and/or functional processes may be implemented using hardware, such as one or more Central Processing Units (CPUs), digital signal processors (DSPs), application-specific-integrated-circuits, field programmable gate arrays (FPGAs) computers or the like.

As disclosed herein, the term "storage medium" or "computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Figure 1B:
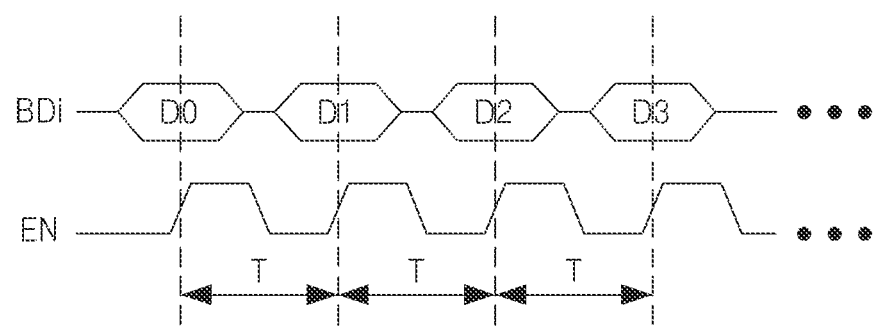
FIG. 1B is an example output timing diagram for buffered data output from the input buffer 30 of FIG. 1.
Figure 1C:
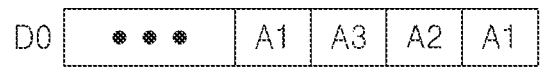
FIG. 1C illustrates an example structure of buffered data illustrated in FIG. 1B.

FIG. 1A is a block diagram of a data compression device 10A according to an example embodiment of inventive concepts. FIG. 1B is an example output timing diagram for buffered data output from the input buffer 30 of FIG. 1A. FIG. 1C illustrates an example structure of the buffered data discussed with regard to FIG. 1B.

Referring to FIGS. 1A-1C, the data compression device 10A includes a data pattern analyzer 20A, the input buffer 30, and a data compression manager 40. In at least the example embodiment shown in FIG. 1A, the data compression device 10A further includes an output buffer 50. In one example, the data compression device 10A may be embodied by an integrated circuit (IC), any hardware discussed herein, or similar hardware.

In one example, the data pattern analyzer 20A may be embodied by hardware discussed herein, such as a processor capable of analyzing a pattern of input data DATA. The data compression manager 40 may be embodied by hardware discussed herein, such as a processor capable of selectively compressing buffered data BDi from the input buffer 30 based on an analysis code INF1 from the data pattern analyzer 20A.

In example operation, the data pattern analyzer 20A analyzes a pattern of the input data DATA transmitted to the input buffer 30, and generates an analysis code INF1 (the analysis result) based on the analyzed pattern. The data pattern analyzer 20A outputs the result of the analysis in the form of the analysis code INF1 to the data compression manager 40.

Still referring to FIG. 1A, the data pattern analyzer 20A includes a header analyzer 21. The header analyzer 21 analyzes an indication bit included in a header HEADER of the input data DATA, and generates the analysis code INF1 based on the analysis of the indication bit. The analysis code INF1 may include one or more bits. That is, for example, the analysis code INF1 may be a single or multi-bit code.

The indication bit included in the header HEADER indicates whether the body data DATA1 of the input data DATA is compressed data. Although discussed as an indication bit, the indication bit may include one or more bits. In one example, when the body data DATA1 is compressed data (e.g., multimedia data), the indication bit included in the header HEADER may have a first value (e.g., 1). On the other hand, when the body data DATA1 of the input data DATA is uncompressed data, the indication bit included in the header HEADER may have a second value (e.g., 0), which is different from the first value.

In this example, the header analyzer 21 outputs an analysis code INF1 having the first value (e.g., 1) when the indication bit has the first value, but outputs an analysis code INF1 having the second value (e.g., 0) when the indication bit has the second value (e.g., 0).

The input buffer 30 buffers the input data DATA received from a data bus, and outputs the buffered data BDi. In one example, when the input data DATA is multi-bit data including 'a' number of bits, the buffered data BDi may also be multi-bit data including 'b' number of bits. In this case, "a" and "b" are natural numbers, and a=b or "b" is an integral multiple of "a".

In a more specific example, when the input data DATA is 8-bit data and the buffered data BDi is 64-bit data, the data pattern analyzer 20A analyzes a pattern of each set of 8-bit input data within a time interval T. The input buffer 30 outputs the buffered data BDi, where i=0, 1, 2, 3, . . . , according to an enable signal EN activated when all of the eight input data DATA are received at the input buffer 30.

Still referring to FIG. 1A, the data compression manager 40 selectively compresses the buffered input data BDi based on the analysis code INF1 output from the data pattern analyzer 20A. The data compression manager 40 then outputs one of the buffered data BDi from the input buffer 30 or compressed data CDATA generated by compressing the buffered data BDi. In other words, the data compression manager 40 bypasses compression of the buffered data BDi or compresses the buffered data BDi to generate the compressed data CDATA.

In one example, when the analysis code INF1 has the second value (e.g., 0), the data compression manager 40 compresses the buffered data BDi from the input buffer 30 to generate the compressed data CDATA, and outputs the compressed data CDATA to the output buffer 50. On the other hand, when the analysis code INF1 has the first value (e.g., 1), the data compression manager 40 outputs the buffered data BDi to the output buffer 50 without being compressed.

In the example embodiment shown in FIG. 1A, the data compression manager 40 includes a memory 41, a processor 43 and a selector 45. The memory 41 receives and stores the analysis code INF1. The selector 45 outputs the buffered data BDi to the output buffer 50 or transmits the buffered data BDi to the processor 43 for compression based on the analysis code INF1 stored at the memory 41. For example, if the analysis code INF1 has the first value, then the selector 45 outputs the buffered data BDi to the output buffer 50. But, if the analysis code INF1 has the second value, then the selector 45 outputs the buffered data BDi to the processor 43 to be compressed. The processor 43 compresses the buffered data BDi output from the selector 45 to generate the compressed data CDATA, and outputs the compressed data CDATA to the output buffer 50.

With regard to the data shown in FIG. 1C, the processor 43 sequentially compresses respective symbols A1, A2, and A3 and outputs information indicative of a relationship between the symbols without compressing a symbol that is the same as a previously compressed symbol. In this example, the processor 43 may compress the first symbol A1, but not the fourth symbol A1. Alternatively, the processor 43 may compress all symbols of the buffered data BDi.

Referring back to FIG. 1A, the output buffer 50 receives and buffers the data (e.g., buffered data BDi or the compressed data CDATA) from the data compression manager 40. The data is then output from the output buffer 50 to a non-volatile memory.

In the example embodiment shown in FIG. 1A, the data pattern analyzer 20A analyzes the pattern of the input data DATA (e.g., the indication bit included in the header HEADER) while the input data DATA is transmitted to the input buffer 30 and/or buffered at the input buffer 30. The data pattern analyzer 20A then transmits the analysis code INF1 to the data compression manager 40 based on the analysis. The data compression manager 40 determines whether to compress the buffered data BDi based on the analysis code INF1.

Because the data compression manager 40 need not separately read each input data DATA stored in the input buffer 30 or each of the buffered data BDi to analyze the pattern of each input data DATA, data compression speed may improve.

Figure 2:
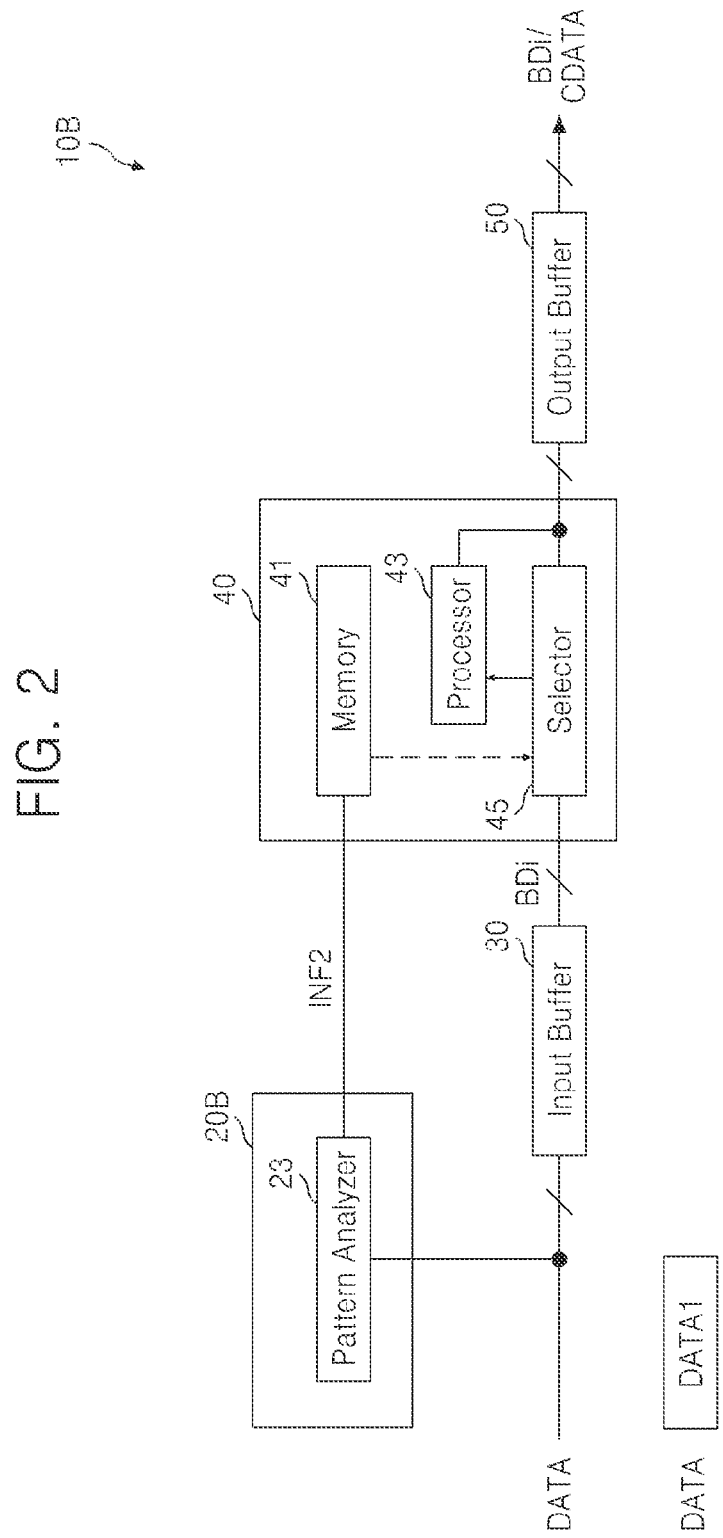
FIG. 2 is a block diagram of a data compression device according to another example embodiment of inventive concepts.

FIG. 2 is a block diagram of a data compression device according to another example embodiment of inventive concepts.

Unlike the input data DATA in FIGS. 1A-1C, the input data DATA in FIG. 2 does not include header information having an indication bit indicating whether the data in the body DATA1 is compressed data.

Referring to FIG. 2, the data compression device 10B includes a data pattern analyzer 20B, the input buffer 30, and the data compression manager 40. In the example embodiment shown in FIG. 2, the data compression device 10B further includes the output buffer 50.

The data pattern analyzer 20B includes a pattern analyzer 23. When the input data DATA is transmitted to the input buffer 30, the pattern analyzer 23 receives the input data DATA, analyzes a pattern of the input data DATA, and outputs an analysis code INF2 based on the analysis result. In this case, the pattern analyzer 23 analyzes the pattern of each input data DATA included in the buffered data D0 of FIG. 1C until a next buffered data D1 of FIG. 1B is output.

In this example, the pattern analyzer 23 counts a frequency of each of a plurality of symbols included in the input data DATA, compares the maximum (or minimum) frequency with a reference value, and outputs a result of the comparison as the analysis code INF2 to the data compression manager 40. A single symbol may include k bits, where "k" is a natural number. In one example, k=8.

FIG. 3 is a table for explaining example operation of the data pattern analyzer 20B shown in FIG. 2.

Referring to FIGS. 2 and 3, the pattern analyzer 23 determines the frequencies 10, 100, 1000, 2, 5, 50, etc. of respective ones of a plurality of symbols AA, BB, CC, DD, EE, FF, etc. included in the input data DATA. The pattern analyzer 23 then compares the maximum (or minimum) frequency with a reference value.

When the maximum frequency is greater than the reference value (e.g., the iteration number of symbols corresponding to the maximum frequency is relatively high), the pattern analyzer 23 outputs an analysis code INF2 having the second value (e.g., 0) to the data compression manager 40. The analysis code INF2 having the second value indicates that the input data DATA should be compressed by the data compression manager 40. In response to the analysis code INF2 having the second value, the data compression manager 40 compresses the buffered data BDi from the input buffer 30 and outputs the compressed data CDATA to a non-volatile memory device (e.g., a flash memory device) directly or through the output buffer 50.

When the maximum frequency is less than or equal to the reference value, the pattern analyzer 23 outputs an analysis code INF2 having the first value (e.g., 1) to the data compression manager 40. The analysis code INF2 having the first value indicates that the buffered data BDi need not be compressed by the data compression manager 40. In response to the analysis code INF2 having the first value, the data compression manager 40 bypasses compression of the buffered data BDi, and transmits the buffered data BDi to the non-volatile memory device directly or through the output buffer 50.

Figure 4:
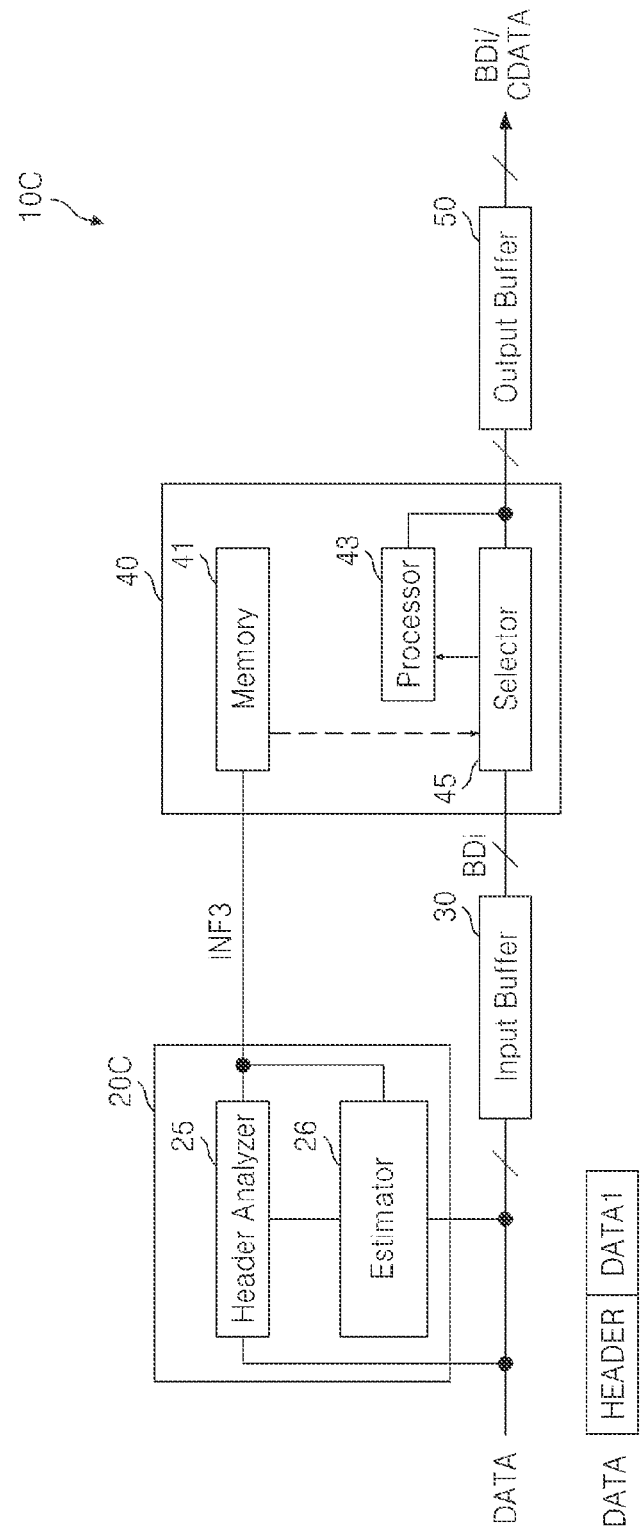
FIG. 4 is a block diagram of a data compression device according to still another example embodiment of inventive concepts.

FIG. 4 is a block diagram of a data compression device 10C according to still another example embodiment of inventive concepts.

Referring to FIG. 4, the data compression device 10C includes a data pattern analyzer 20C, the input buffer 30, and the data compression manager 40. In the example embodiment shown in FIG. 4, the data compression device 10C further includes the output buffer 50.

The data pattern analyzer 20C includes a header analyzer 25 and an estimator 26.

The header analyzer 25 analyzes an indication bit included in the header HEADER of the input data DATA. Based on the indication bit, the header analyzer 25 outputs a control signal to the estimator 26, and a first control code to the data compression manager 40. The control signal controls an operation of the estimator 26, and the first control code controls an operation of the data compression manager 40.

If the indication bit has the first value (e.g., 1), indicating that the data included in the body DATA1 is compressed data, then the header analyzer 25 disables operation of the estimator 26 by outputting a control signal having a first value (e.g., a control signal having a low level) to the estimator 26. The header analyzer 25 also outputs a first control code to the data compression manager 40. In this example, the first control code instructs the data compression manager 40 to bypass compression of the buffered data BDi.

If the indication bit has the second value (e.g., 0), indicating that the data included in the body DATA1 is uncompressed data, then the header analyzer 25 enables operation of the estimator 26 by outputting a control signal (e.g., an activation control signal having a high level) to the estimator 26.

When enabled, the estimator 26 counts the frequencies (e.g., 10, 100, 1000, 2, 5, 50, etc.) of the respective symbols (e.g., AA, BB, CC, DD, EE, FF, etc.) included in the input data DATA (e.g., the body DATA1) as illustrated, for example, in FIG. 3.

Still referring to FIG. 4, the estimator 26 also assigns codewords 1011, 101, 10, 10101, 10001, 110, etc. to the respective symbols AA, BB, CC, DD, EE, FF, etc. according to a coding rule. The estimator 26 then estimates the size of the compressed data CDATA based on the frequencies 10, 100, 1000, 2, 5, 50, etc. of the respective symbols AA, BB, CC, DD, EE, FF, etc. and the numbers of bits 4, 3, 2, 5, 5, 3, etc. of the respective codewords 1011, 101, 10, 10101, 10001, 110, etc. assigned to the respective symbols AA, BB, CC, DD, EE, FF, etc. The estimator 26 then compares the estimated size of the compressed data (hereinafter, referred to as the "estimated data ECDATA") with the size of reference data, and outputs a result of the comparison to the data compression manager 40.

In one example, the estimator 26 calculates the size of estimated data ECDATA according to Equation 1.

$$ECDATA = \left(\sum_{i=1}^{n} f_i B_i\right) \quad \text{[Equation 1]}$$

In Equation 1, "n" is a natural number and denotes the total number of symbols of data included in the body DATA1, "$f_i$" denotes the frequency of the i-th symbol, and "$B_i$" denotes the number of bits of the codeword assigned to the i-th symbol.

For example, with regard to FIG. 3, the frequency of the symbol AA is 10, the number of bits of the codeword 1011 assigned to symbol AA is 4, the frequency of the symbol CC is 1000, and the number of bits of the codeword 10 assigned to the symbol CC is 2, etc.

In a more specific example, if the size of the input data DATA is 5 Kbyte, the size of the reference data is 3 Kbyte, and the size of the estimated data ECDATA calculated according to Equation 1 is greater than 3 Kbyte, then the estimator 26 outputs a second control code indicating that compression of the buffered data BDi should be bypassed.

On the other hand, if the size of the estimated data ECDATA calculated according to Equation 1 is less than 3 Kbyte, then the estimator 26 outputs the second control code indicating that the buffered data BDi should be compressed.

According to at least some example embodiments, the size of the reference data may be c times the size of the input data DATA, where "c" is a decimal fraction (e.g., about 0.6).

The analysis code INF3 shown in FIG. 4 includes a first control code generated according to an indication bit included in the header HEADER and a second control code generated based on a result of the comparison between the size of the estimated data ECDATA and the size of the reference data.

As described with reference to FIGS. 1A-4, the buffered data BDi is output by the data compression manager 40 without being compressed if: the data included in the body DATA1 is already compressed; or the data included in the body DATA1 is uncompressed data and the size of the estimated data ECDATA is greater than that of the reference data.

Still referring to FIG. 4, the data compression manager 40 analyzes the analysis code INF3 from the data pattern analyzer 20C, and outputs the buffered data BDi or the compressed data CDATA according to a result of the analysis. When the data included in the body DATA1 is uncompressed data and the size of the estimated data ECDATA is less than that of the reference data, the data compression manager 40 compresses the buffered data BDi according to the analysis code INF3 output from the data pattern analyzer 20C and outputs the compressed data CDATA.

As described above, while each input data DATA is transmitted to the input buffer 30, the data pattern analyzer 20C analyzes a pattern of each input data DATA and transmits the analysis code INF3 to the data compression manager 40. The data compression manager 40 selectively compresses the buffered data BDi according to the analysis code INF3.

Figure 5:
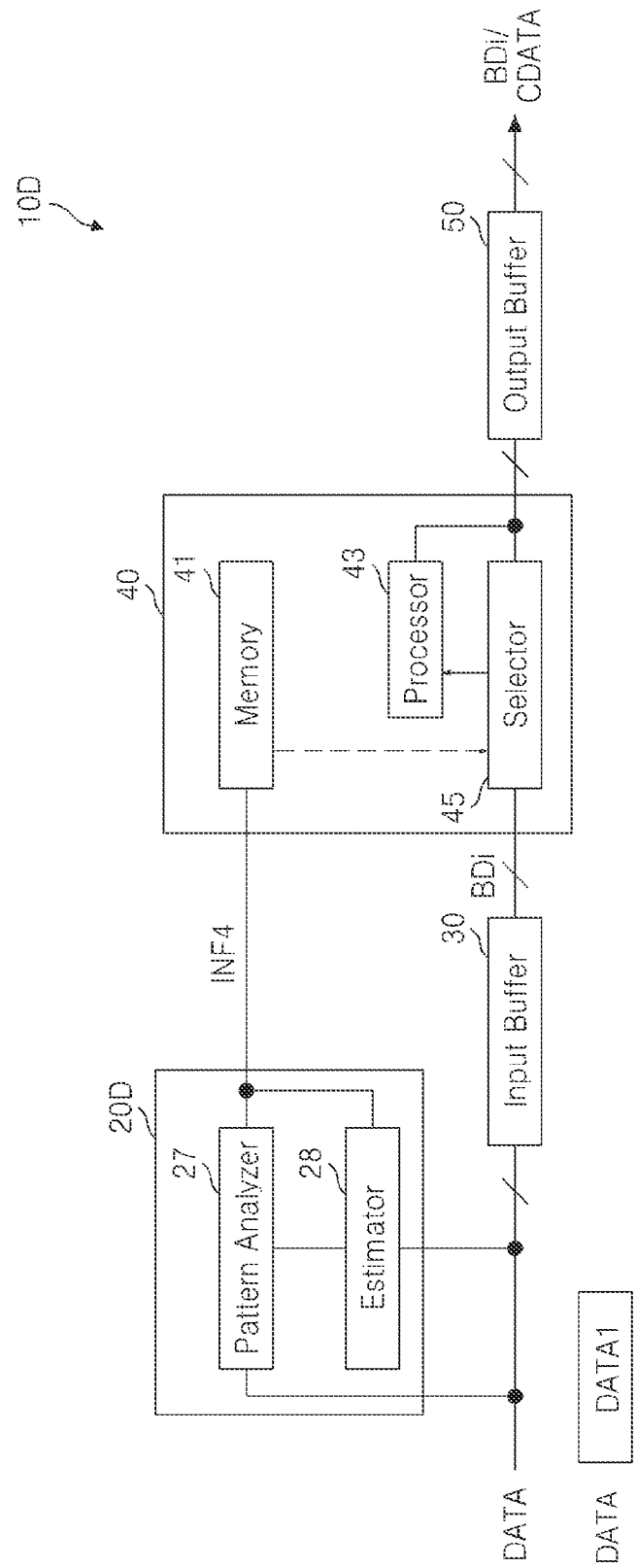
FIG. 5 is a block diagram of a data compression device according to still another example embodiment of inventive concepts.

FIG. 5 is a block diagram of a data compression device 10D according to still another example embodiment of inventive concepts.

Referring to FIG. 5, the data compression device 10D includes a data pattern analyzer 20D, the input buffer 30, and the data compression manager 40. In at least this example embodiment, the data compression device 10D further includes the output buffer 50.

The data pattern analyzer 20D includes a pattern analyzer 27 and an estimator 28. Example operation of the data compression device 10D will be discussed with regard to the example table shown in FIG. 3.

Referring to FIGS. 3 and 5, the pattern analyzer 27 counts the frequencies 10, 100, 1000, 2, 5, 50, etc. of the respective symbols AA, BB, CC, DD, EE, FF, etc. included in the input data DATA, and assigns the codewords 1011, 101, 10, 10101, 10001, 110, etc. to respective symbols AA, BB, CC, DD, EE, FF, etc. according to a coding rule. The pattern analyzer 27 then transmits the frequencies 10, 100, 1000, 2, 5, 50, etc. and the codewords 1011, 101, 10, 10101, 10001, 110, etc. to the estimator 28.

The estimator 28 estimates the size of the estimated data ECDATA based on the received frequencies 10, 100, 1000, 2, 5, 50, etc. and the numbers of bits 4, 3, 2, 5, 5, 3, etc. of the respective codewords 1011, 101, 10, 10101, 10001, 110, etc. according to Equation 1. The estimator 28 then compares the size of the estimated data ECDATA with the size of the reference data, generates an analysis code INF4 according to a result of the comparison, and outputs the analysis code INF4 to the data compression manager 40.

When the size of the estimated data ECDATA is smaller than the size of the reference data (e.g., the compression efficiency is superior), the data compression manager 40 compresses the buffered data BDi according to the analysis code INF4 (e.g., having a second value, such as 0) output from the data pattern analyzer 20D, and outputs the compressed data CDATA to the output buffer 50. However, when the size of the estimated data ECDATA is greater than the size of the reference data (e.g., the compression efficiency is inferior), the data compression manager 40 outputs the buffered data BDi according to the analysis code INF4 (e.g., having a first value, such as 1) from the data pattern analyzer 20D. In this example, a size of the estimated data ECDATA that is smaller than the size of the reference data indicates a superior compression efficiency, whereas a size of the estimated data ECDATA that is larger than the size of the reference data indicates inferior compression efficiency.

Figure 13:
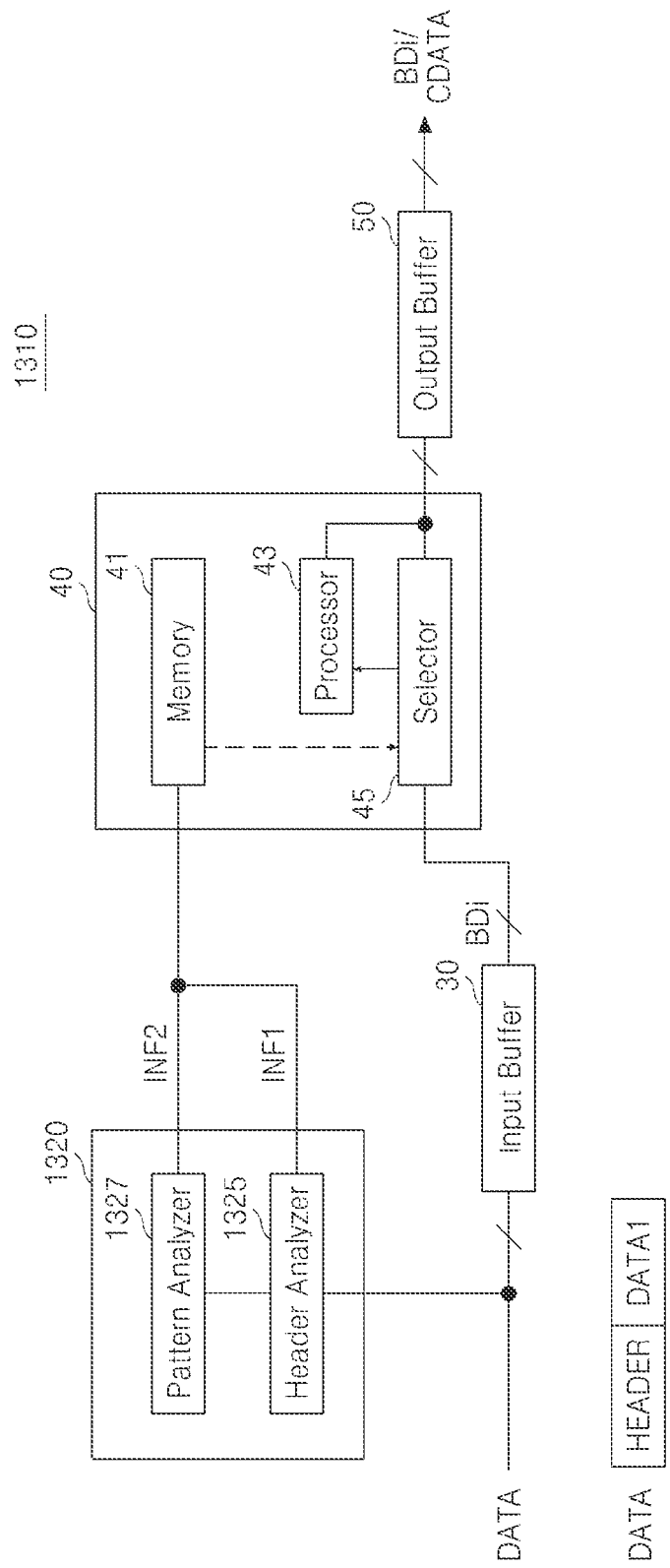
FIG. 13 is a block diagram of a data compression device according to still another example embodiment of inventive concepts.

FIG. 13 is a block diagram of a data compression device 1310 according to still another example embodiment of inventive concepts.

Referring to FIG. 13, the data compression device 1310 includes a data pattern analyzer 1320, the input buffer 30, and the data compression manager 40. In at least this example embodiment, the data compression device 1310 further includes the output buffer 50.

The data pattern analyzer 1320 includes a header analyzer 1325 and a pattern analyzer 1327. The data pattern analyzer 1320 shown in FIG. 13 is similar to the data pattern analyzers 20A in FIGS. 1A and 20B in FIG. 2, except that the data pattern analyzer 1320 includes both a header analyzer 1325 and a pattern analyzer 1327. Example operation of the data compression device 1310 will be discussed in more detail below with regard to the flow chart shown in FIG. 6.

Referring to FIG. 13, the header analyzer 1325 detects whether the input data DATA includes a header HEADER. If the input data DATA includes a header HEADER, then the header analyzer 1325 analyzes an indication bit included in the header HEADER of the input data DATA, and generates the analysis code INF1 based on the analysis of the indication bit. The analysis code INF1 and the indication bit discussed with regard to FIG. 13 are the same or substantially the same as the analysis code INF1 and the indication bit discussed above with regard to, for example, FIG. 1A.

As in FIG. 1A, in this example, the header analyzer 1325 outputs the analysis code INF1 having the first value (e.g., 1) when the indication bit has the first value (e.g., 1), but outputs an analysis code INF1 having the second value (e.g., 0) when the indication bit has the second value (e.g., 0).

Still referring to FIG. 13, the data pattern analyzer 1320 also includes a pattern analyzer 1327. If the header analyzer 1325 does not detect a header HEADER in the input data DATA, the pattern analyzer 1327 receives the input data DATA, analyzes a pattern of the input data DATA, and outputs an analysis code INF2 based on the analysis result. In this case, the pattern analyzer 1327 analyzes the pattern of each input data DATA.

In this example, the pattern analyzer 1327 counts a frequency of each of a plurality of symbols included in the input data DATA, compares the maximum (or minimum) frequency with a reference value, and outputs a result of the comparison as the analysis code INF2 to the data compression manager 40. As discussed above, a single symbol may include k bits, where "k" is a natural number. In one example, k=8.

The input buffer 30 buffers the input data DATA received from a data bus, and outputs the buffered data BDi. In one example, when the input data DATA is multi-bit data including 'a' number of bits, the buffered data BDi may also be multi-bit data including 'b' number of bits. In this case, "a" and "b" are natural numbers, and a=b or "b" is an integral multiple of "a".

Still referring to FIG. 1A, the data compression manager 40 selectively compresses the buffered input data BDi based on the analysis code INF1 or INF2 output from the data pattern analyzer 1320. The data compression manager 40 then outputs one of the buffered data BDi from the input buffer 30 or compressed data CDATA generated by compressing the buffered data BDi. In other words, the data compression manager 40 bypasses compression of the buffered data BDi or compresses the buffered data BDi to generate the compressed data CDATA.

In one example, when the analysis code INF1 or INF2 has the second value (e.g., 0), the data compression manager 40 compresses the buffered data BDi from the input buffer 30 to generate the compressed data CDATA, and outputs the compressed data CDATA to the output buffer 50. On the other hand, when the analysis code INF1 or INF2 has the first value (e.g., 1), the data compression manager 40 outputs the buffered data BDi to the output buffer 50 without being compressed.

In the example embodiment shown in FIG. 1A, the data compression manager 40 includes a memory 41, a processor 43 and a selector 45. The memory 41 receives and stores the analysis code INF1 or INF2. The selector 45 outputs the buffered data BDi to the output buffer 50 or transmits the buffered data BDi to the processor 43 for compression based on the analysis code INF1 or INF2 stored at the memory 41. For example, if the analysis code INF1 or INF2 has the first value, then the selector 45 outputs the buffered data BDi to the output buffer 50. But, if the analysis code INF1 or INF2 has the second value, then the selector 45 outputs the buffered data BDi to the processor 43 to be compressed. The processor 43 compresses the buffered data BDi output from the selector 45 to generate the compressed data CDATA, and outputs the compressed data CDATA to the output buffer 50.

The output buffer 50 receives and buffers the data (e.g., buffered data BDi or the compressed data CDATA) from the data compression manager 40. The data is then output from the output buffer 50 to a non-volatile memory.

Figure 6:
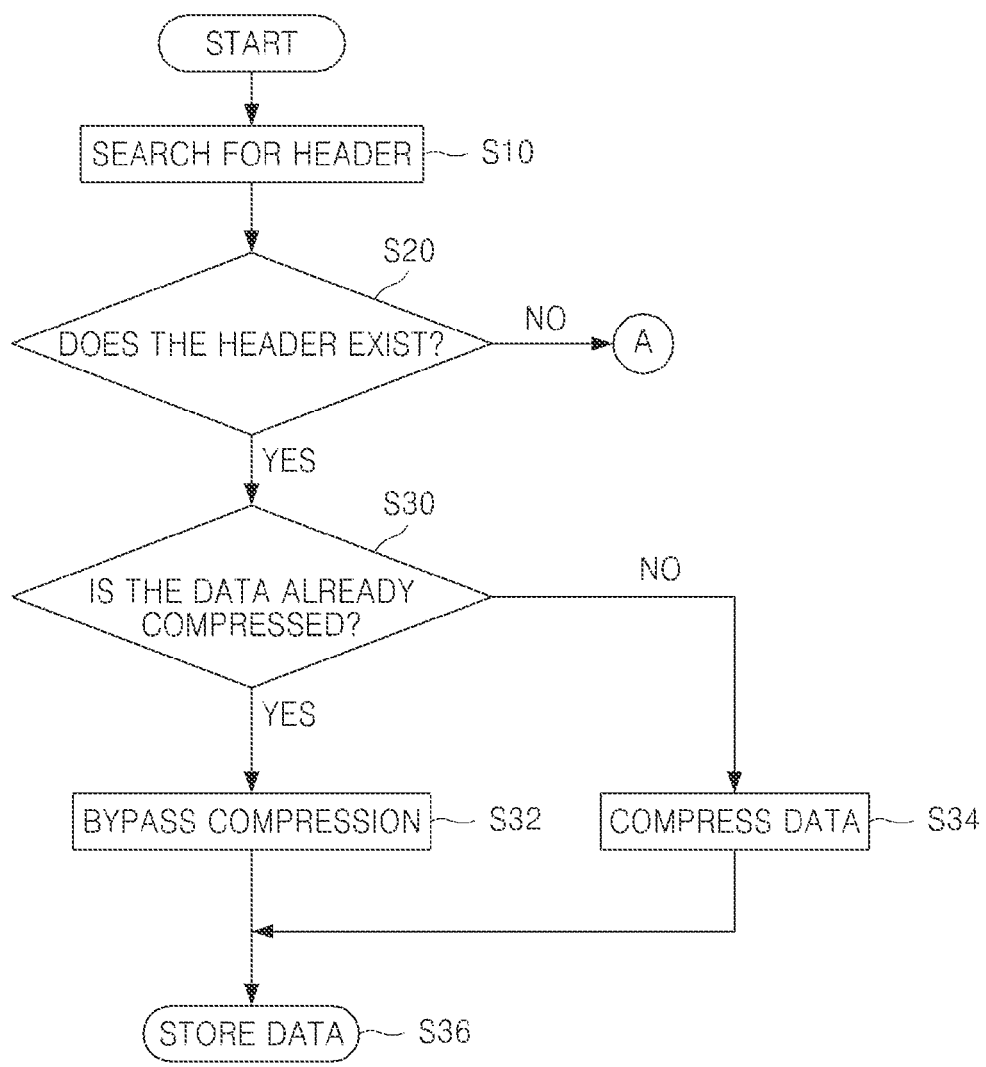
FIG. 6 is a flowchart for explaining an example embodiment of a method of operating a data compression device.

FIG. 6 is a flowchart for explaining an example operation of a data compression device according to an example embodiment. The method discussed with regard to FIG. 6 may be used in conjunction with a data compression device having a data pattern analyzer including a header analyzer and a pattern analyzer. An example embodiment of such a data compression device is shown in FIG. 13. Accordingly, the method shown in FIG. 6 will be discussed with regard to the data compression device 1310 shown in FIG. 13.

Referring to FIGS. 6 and 13, at S10 the header analyzer 1325 detects whether the input data DATA includes a header HEADER. If the header analyzer 1325 determines that the input data DATA includes the header HEADER, then the header analyzer 1325 determines whether the input data DATA is already compressed based on the indication bit included in the header HEADER at S30. The header analyzer 1325 determines that the input data DATA is already compressed when the indication bit included in the header HEADER indicates that the data included in the body DATA1 is compressed data.

If the header analyzer 1325 determines that the body DATA1 is compressed data at S30, then the header analyzer 1325 transmits the analysis code INF1 indicating that the input data DATA is already compressed to the data compression manager 40. As a result, the data compression manager 40 outputs (bypasses compression of) the buffered data BDi to the output buffer 50 without compression at S32. The buffered data BDi bypassed by the data compression manager 40 is then stored in a non-volatile memory device directly or through the output buffer 50 at S36.

Returning to S30, if the header analyzer 1325 determines that the data included in the body DATA1 is uncompressed data, then the header analyzer 1325 transmits to the data compression manager 40 the analysis code INF1 indicating that the data included in the body DATA1 is uncompressed data. In response to the analysis code INF1, the data compression manager 40 compresses the buffered data BDi to generate the compressed data CDATA at S34. The compressed data CDATA output from the data compression manager 40 is then stored in a non-volatile memory device directly or through the output buffer 50 at S36.

Returning now to S20 in FIG. 6, if the header analyzer 1325 determines that the header HEADER does not exist in the input data DATA at S20, then the process continues as discussed below with regard to FIG. 7.

Figure 7:
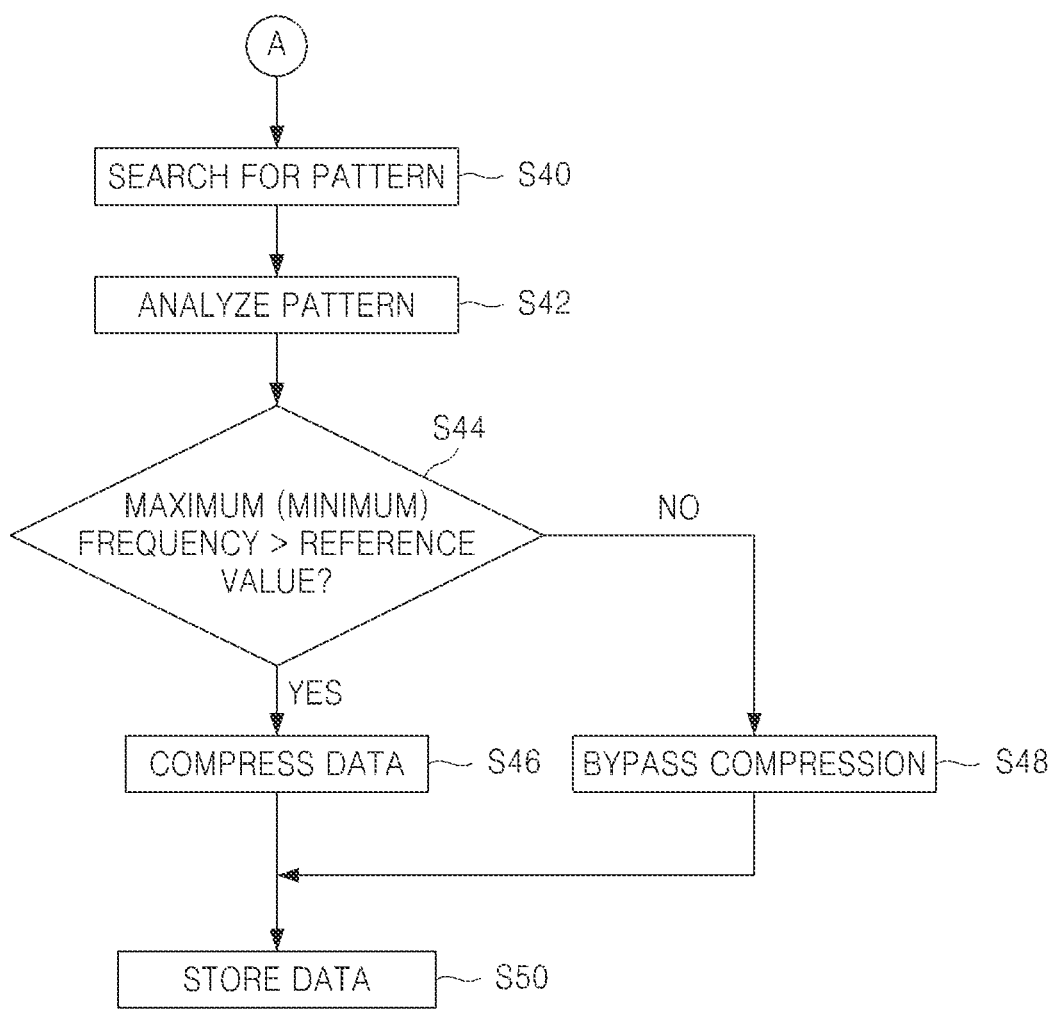
FIG. 7 is a flowchart for explaining another example embodiment of a method of operating a data compression device.

FIG. 7 is a flowchart for explaining another example embodiment of a method of operating a data compression device. The method shown in FIG. 7 may be implemented in conjunction with, for example, the data compression devices 10B, 10C, and/or 1310. For example purposes, however, the flow chart shown in FIG. 7 will be described with regard to the data compression device 10B shown in FIG. 2. However, it should be understood that the data compression device 1310 may perform the same or substantially the same operations.

Referring to FIG. 7, the pattern analyzer 23 of FIG. 2 searches for a pattern of the input data DATA at S40. The pattern analyzer 23 then analyzes a pattern of the input data DATA at S42. In this example, the pattern analyzer 23 counts the frequency of each symbol included in the input data DATA. At S44, the pattern analyzer 23 compares the maximum frequency (or the minimum frequency) of the counted frequencies with the reference value.

If the maximum frequency (or the minimum frequency) is greater than or equal to the reference value, then the pattern analyzer 23 transmits to the data compression manager 40 the analysis code INF2 indicating that the buffered data BDi should be compressed. In response to the analysis code INF2, the data compression manager 40 compresses the buffered data BDi at S46. The compressed data CDATA is then stored in the non-volatile memory device either directly or through the output buffer 50 at S50.

Returning to S44, when the maximum frequency (or the minimum frequency) is less than the reference value, the pattern analyzer 23 transmits to the data compression manager 40 the analysis code INF2 indicating that the buffered data BDi need not be compressed. In response to the analysis code INF2, the data compression manager 40 outputs the buffered data BDi to the output buffer 50 at S48 without being compressed. The buffered data BDi stored in the output buffer 50 is then stored in the non-volatile memory device at S50.

Figure 8:
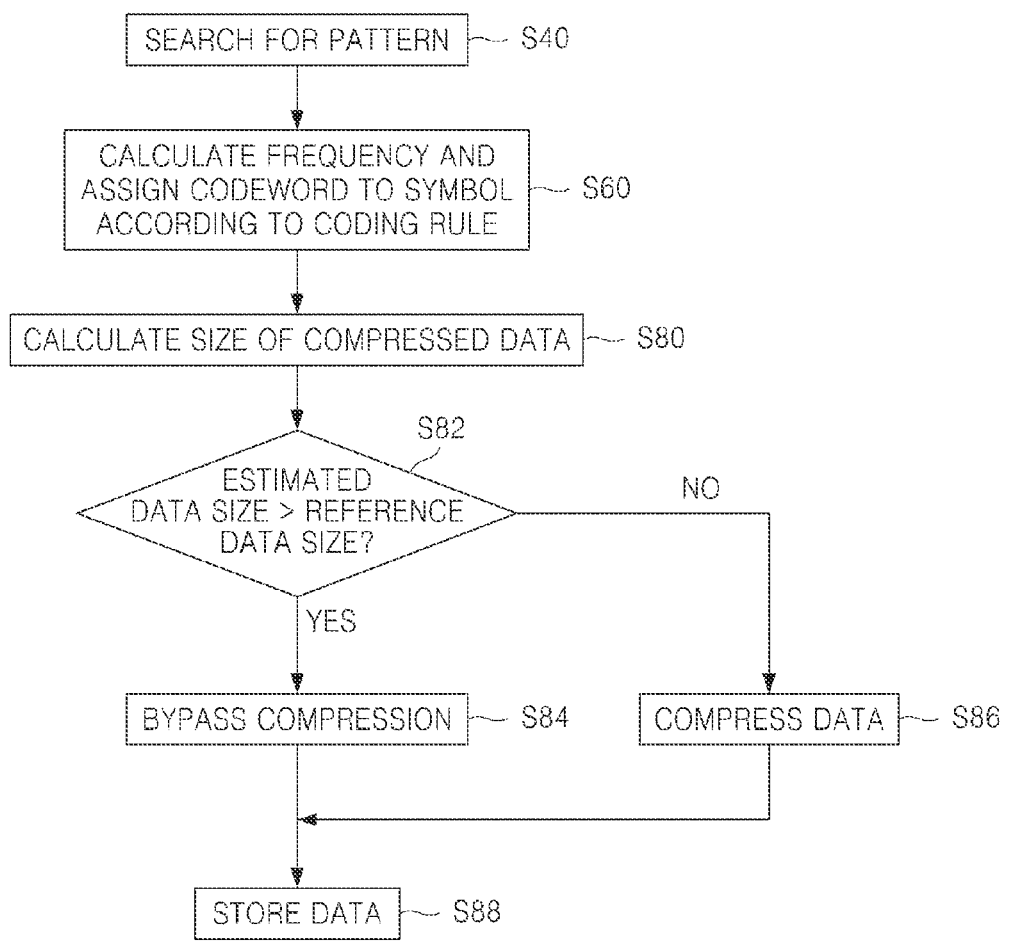
FIG. 8 is a flowchart for explaining yet another example embodiment of a method of operating a data compression device.

FIG. 8 is a flowchart for explaining another example embodiment of a method of operating a data compression device. The method shown in FIG. 8 may be implemented in conjunction with the data compression device 10D of FIG. 5.

Referring to FIG. 8, at S40 the pattern analyzer 27 of FIG. 5 searches for a pattern of the input data DATA.

At S60, the pattern analyzer 27 counts the frequency of each symbol included in the input data DATA, assigns a codeword to each of the symbols according to a coding rule, and outputs the frequency of each symbol and the codeword assigned to each symbol to the estimator 28.

At S80, the estimator 28 calculates the size of the estimated data ECDATA using the frequency of each symbol output from the pattern analyzer 27 and the number of bits of the codeword assigned to each of the symbols, according to Equation 1.

At S82, the estimator 28 compares the size of the estimated data ECDATA with the size of the reference data.

If the size of the estimated data ECDATA is greater than that of the reference data, then the estimator 28 transmits to the data compression manager 40 the analysis code INF4 indicating that the buffered data BDi need not be compressed. As a result, the data compression manager 40 outputs the buffered data BDi to the output buffer 50 at S84 without being compressed. The buffered data BDi stored in the output buffer 50 is then stored in the non-volatile memory device at S88.

Returning to S82, when the size of the estimated data ECDATA is less than or equal to that of the reference data, the estimator 28 transmits to the data compression manager 40 the analysis code INF4 indicating that the buffered data BDi should be compressed. In response to the analysis code INF4, and the data compression manager 40 compresses the buffered data BDi at S86. The compressed data CDATA is then stored in the non-volatile memory device at S88 either directly or through the output buffer 50.

According to at least some example embodiments, the pattern analyzer 27 counts the frequency of each symbol included in the input data DATA and assigns a codeword to each symbol according to a coding rule. The coding rule may be a Huffman coding rule, a Lempel Zip Welch (LZW) coding rule, an arithmetic coding rule, a run length encoding (RLE), or any other suitable coding rule. The Huffman coding rule may be a static Huffman coding rule or a dynamic Huffman coding rule.

Figure 9:
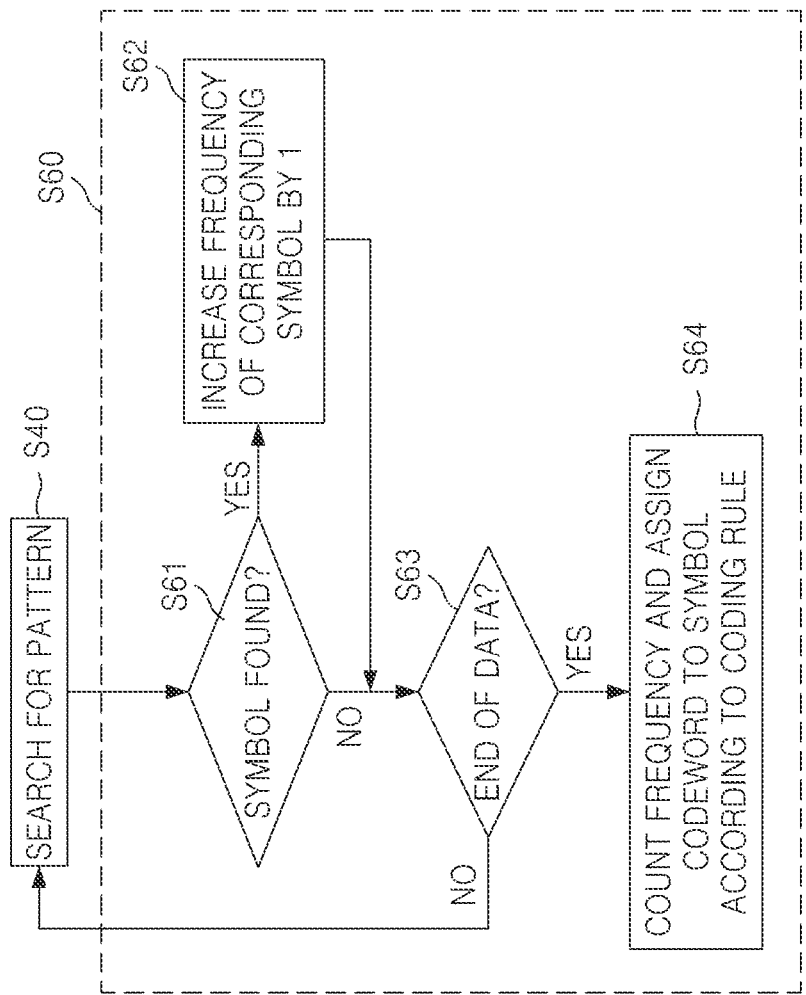
FIG. 9 is a flowchart for explaining an example embodiment a method of operating a pattern analyzer using a static Huffman coding rule.

FIG. 9 is a flowchart for explaining an example embodiment of a method of operating the pattern analyzer 27 of FIG. 5 using a static Huffman coding rule.

Referring to FIGS. 5 and 9, the pattern analyzer 27 searches for a pattern of the input data DATA at S40. Each time a symbol is found in the input data DATA at S61, the pattern analyzer 27 increases (or increments) the frequency of a corresponding symbol by +1 at S62.

The pattern analyzer 27 then determines whether the end of the input data DATA has been reached at S63. If the end of the input data DATA has been reached, then the pattern analyzer 27 counts the frequency of each symbol included in the input data DATA and assigns a codeword to each symbol according to a coding rule at S64. In this example, the coding rule is a static Huffman coding rule.

Returning to S63, if the end of the input data DATA has not been reached, then the process returns to S40 and continues as discussed above for a next symbol in the input data DATA.

Returning to S61, if the pattern analyzer 27 does not find a symbol in the input data DATA, then the process proceeds to S63 and continues as discussed above.

Figure 10:
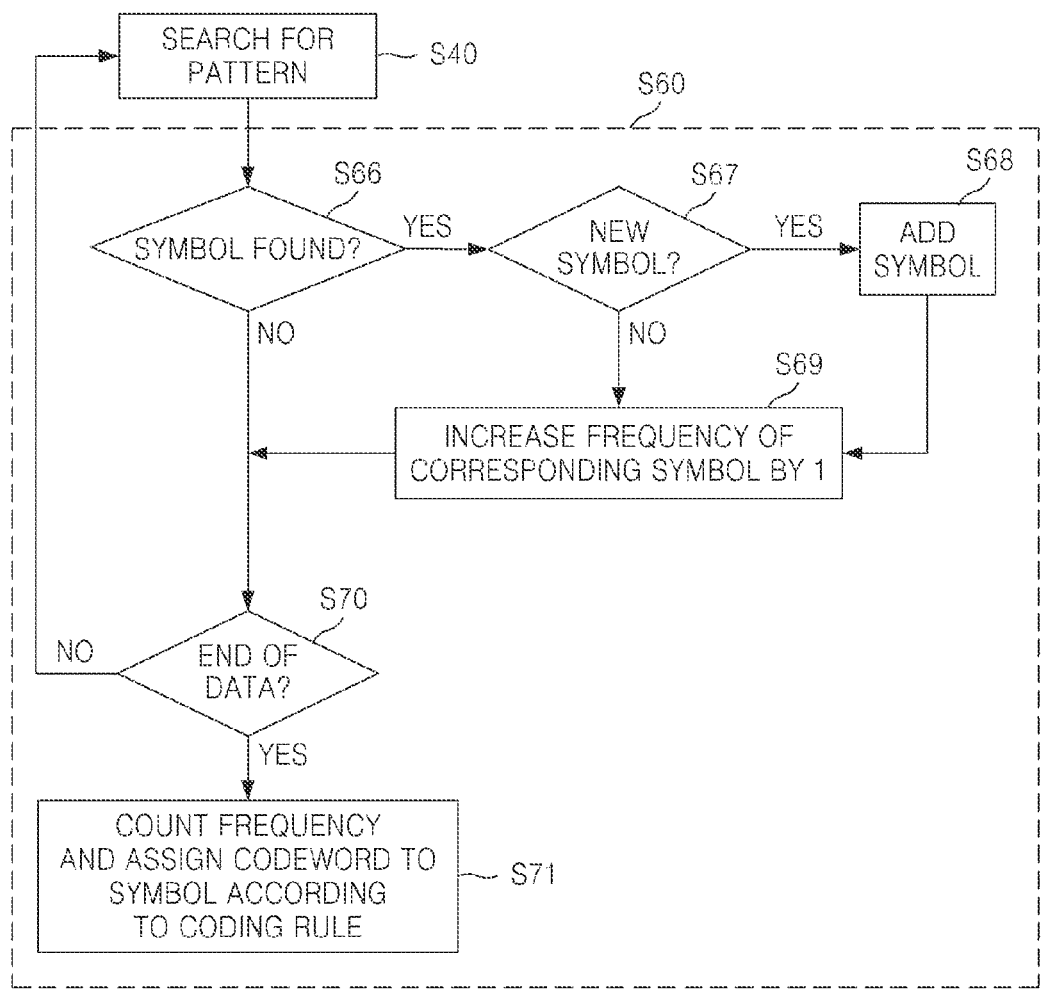
FIG. 10 is a flowchart for explaining an example embodiment of a method of operating a pattern analyzer using a dynamic Huffman coding rule.

FIG. 10 is a flowchart for explaining an example embodiment of a method of operating the pattern analyzer 27 of FIG. 5 using a dynamic Huffman coding rule.

Referring to FIGS. 5 and 10, the pattern analyzer 27 searches for a pattern of the input data DATA at S40.

When a symbol included in the input data DATA is found at S66, the pattern analyzer 27 determines whether the symbol is a new symbol at S67. If the symbol is a new symbol, then the pattern analyzer 27 adds the symbol to a symbol list at S68, and increases (or increments) the frequency of a corresponding symbol by +1 at S69.

The pattern analyzer 27 then checks whether the end of the input data DATA has been reached. If the end of the input data DATA has been reached at S70, then the pattern analyzer 27 counts the frequency of each symbol included in the input data DATA and assigns a codeword to each symbol according to a coding rule at S71. In this example, the coding rule is a dynamic Huffman coding rule.

Returning to S70, if the end of the input data DATA has not been reached, then the process returns to S40 and continues as discussed above for the remaining portion of the input data DATA.

Returning to S67, when a found symbol is not a new symbol, the process proceeds to S69 and continues as discussed above.

Returning to S66, if a symbol is not found in the input data DATA, then the process proceeds to S70 and continues as discussed above.

Figure 14:
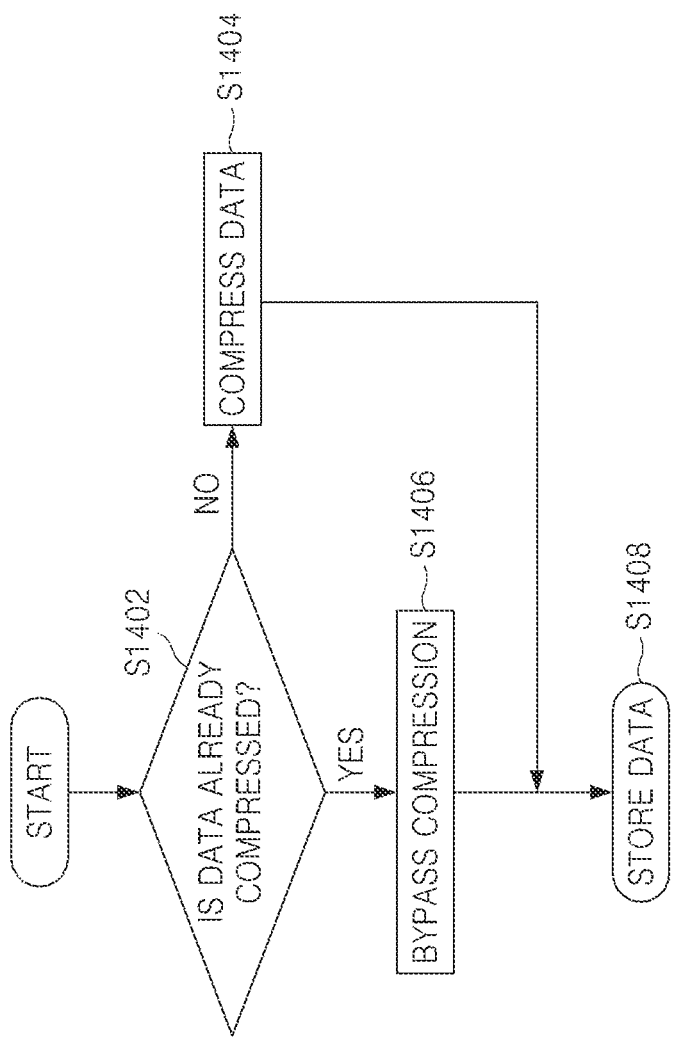
FIG. 14 is a flowchart for explaining another example embodiment of a method of operating a data compression device.

FIG. 14 is a flowchart for explaining an example embodiment of a method of operating the data compression device 10A of FIG. 1A.

Referring to FIGS. 1A and 14, the header analyzer 21 determines whether the input data DATA is already compressed based on the indication bit included in the header HEADER at S1402. The header analyzer 21 determines that the input data DATA is already compressed when the indication bit included in the header HEADER indicates that the data included in the body DATA1 is compressed data.

If the header analyzer 21 determines that the data included in the body DATA1 is compressed data at S1402, then the header analyzer 21 transmits the analysis code INF1 indicating that the data is already compressed to the data compression manager 40. As a result, the data compression manager 40 outputs (bypasses compression of) the buffered data BDi to the output buffer 50 without compression at S1406. The buffered data BDi bypassed by the data compression manager 40 is then stored in a non-volatile memory device directly or through the output buffer 50 at S1408.

Returning to S1402, if the header analyzer 21 determines that the data included in the body DATA1 is uncompressed data, then the header analyzer 21 transmits to the data compression manager 40 the analysis code INF1 indicating that the data included in the body DATA1 is uncompressed data. In response to the analysis code INF1, the data compression manager 40 compresses the buffered data BDi to generate the compressed data CDATA at S1404. The compressed data CDATA output from the data compression manager 40 is then stored in a non-volatile memory device directly or through the output buffer 50 at S1408.

Figure 15:
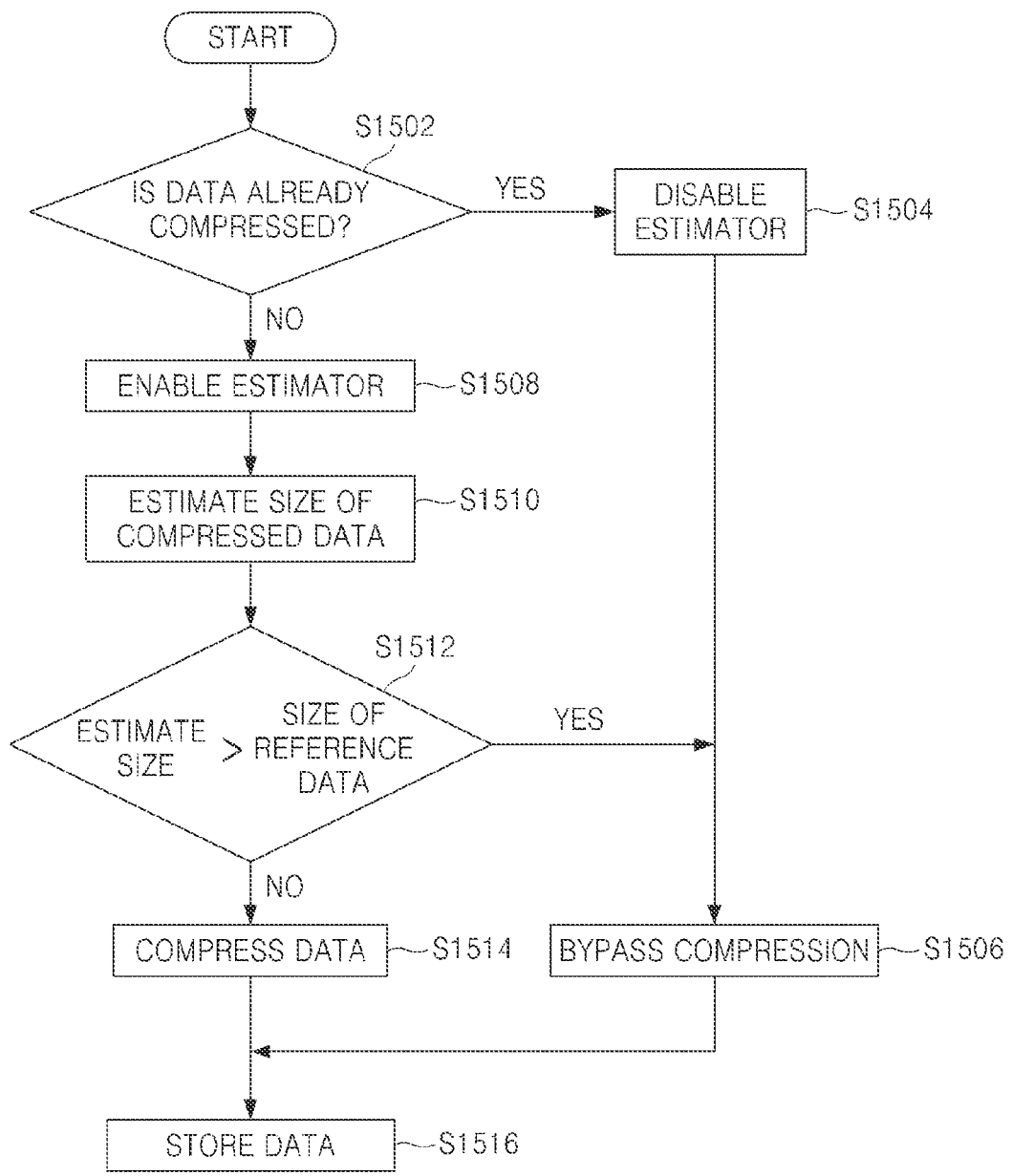
FIG. 15 is a flowchart for explaining still another example embodiment of a method of operating a data compression device.

FIG. 15 is a flowchart for explaining an example embodiment of a method of operating the data compression device 10C of FIG. 4.

At S1502, the header analyzer 25 determines whether the input data DATA is compressed data by analyzing an indication bit included in the header HEADER of the input data DATA. If the indication bit has the first value (e.g., 1), indicating that the data included in the body DATA1 is compressed data, then the header analyzer 25 disables operation of the estimator 26 at S1504 by outputting a control signal having a first value (e.g., a control signal having a low level) to the estimator 26. At S1506, the header analyzer 25 outputs the analysis code INF3 to the data compression manager 40 instructing the data compression manager 40 to bypass compression of the buffered data BDi.

Returning to S1502, if the indication bit has the second value (e.g., 0), indicating that the data included in the body DATA1 is uncompressed data, then the header analyzer 25 enables operation of the estimator 26 at S1508 by outputting a control signal (e.g., an activation control signal having a high level) to the estimator 26.

At S1510, the estimator 26 estimates the size of the compressed data CDATA as discussed above with regard to FIG. 4.

At S1512, the estimator 26 compares the estimated size of the compressed data (hereinafter, referred to as the "estimated data ECDATA") with the size of reference data. The reference data discussed here is the same as the reference data discussed above.

If the size of the estimated data ECDATA is greater than that of the reference data, then the estimator 26 transmits to the data compression manager 40 the analysis code INF3 indicating that the buffered data BDi need not be compressed. As a result, the data compression manager 40 outputs the buffered data BDi to the output buffer 50 at S1506 without being compressed. The buffered data BDi stored in the output buffer 50 is then stored in the non-volatile memory device at S1516.

Returning to S1512, when the size of the estimated data ECDATA is less than or equal to that of the reference data, the estimator 26 transmits to the data compression manager 40 the analysis code INF3 indicating that the buffered data BDi should be compressed. In response to the analysis code INF3, the data compression manager 40 compresses the buffered data BDi at S1514. The compressed data CDATA is then stored in the non-volatile memory device at S1516 either directly or through the output buffer 50.

Figure 11:
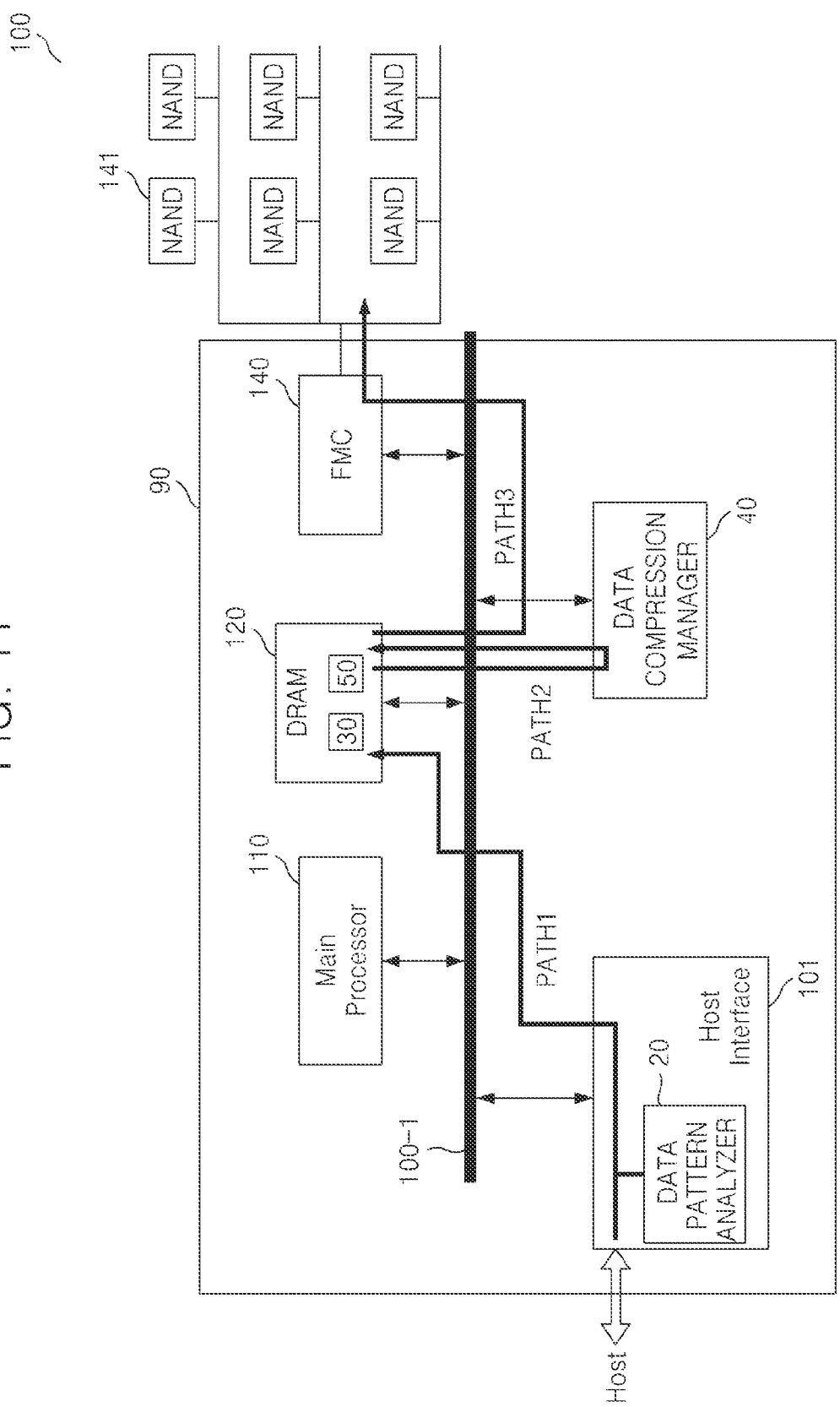
FIG. 11 illustrates a data processing system including a data compression device according to an example embodiment of inventive concepts.

FIG. 11 illustrates a data processing system 100 according to an example embodiment of inventive concepts. The data processing system 100 may include an example embodiment of a data compression device 10A, 10B, 10C, 10D, or 1310 of FIG. 1A, 2, 4, 5, or 13. The data processing system 100 may be embodied by a solid state drive (SSD) or the like.

The data processing system 100 includes a data pattern analyzer 20, which may be one of the data pattern analyzers 20A through 20D and 1320.

Referring to FIG. 11, the data processing system (or the data processing apparatus) 100 includes a memory controller 90 and a plurality of flash memory (e.g., NAND) devices 141. The memory controller 90 includes a host interface 101 including the data pattern analyzer 20, the data compression manager 40, a main processor 110, a volatile memory 120, and a flash management controller (FMC) 140. Each of the elements 40, 101, 110, 120, and 140 may perform data communications via a data bus 100-1. The host interface 101 performs interface functions for data communications between a host (not shown) and the memory controller 90.

In one example, the volatile memory 120 may be embodied by a dynamic random access memory (DRAM), and may perform functions of the input buffer 30 and the output buffer 50 illustrated in FIG. 1A, 2, 4, 5, or 13.

While the input data DATA output from the host is transmitted to the volatile memory 120 via a first data path PATH1, the data pattern analyzer 20 receives the input data DATA and analyzes a pattern of the received input data DATA. The pattern of the input data DATA is analyzed according to one or more of the example methods described above with reference to FIGS. 1A-10, 13, 14, and 15.

The data pattern analyzer 20 transmits the analysis codes INF1, INF2, INF3, or INF4 according to a result of the analysis to the data compression manager 40 via the bus 100-1.

If the analysis codes INF1, INF2, INF3, or INF4 indicates that the data need not be compressed, then the data compression manager 40 outputs the buffered data BDi read from the input buffer 30 of the volatile memory 120 via a second data path PATH2 without being compressed and stores the buffered data BDi in the output buffer 50 of the volatile memory 120.

If the analysis codes INF1, INF2, INF3, or INF4 indicates that the data should be compressed, then the data compression manager 40 compresses the buffered data BDi read from the input buffer 30 of the volatile memory 120 via the second data path PATH2 and stores the compressed data CDATA in the output buffer 50 of the volatile memory 120.

The data stored in the output buffer 50 of the volatile memory 120 (e.g., the buffered data BDi or the compressed data CDATA) is transmitted to the FMC 140 via a third data path PATH3. The buffered data BDi or the compressed data CDATA is then output to at least one of the flash memory device 141 according to the control of the FMC 140.

Figure 12:
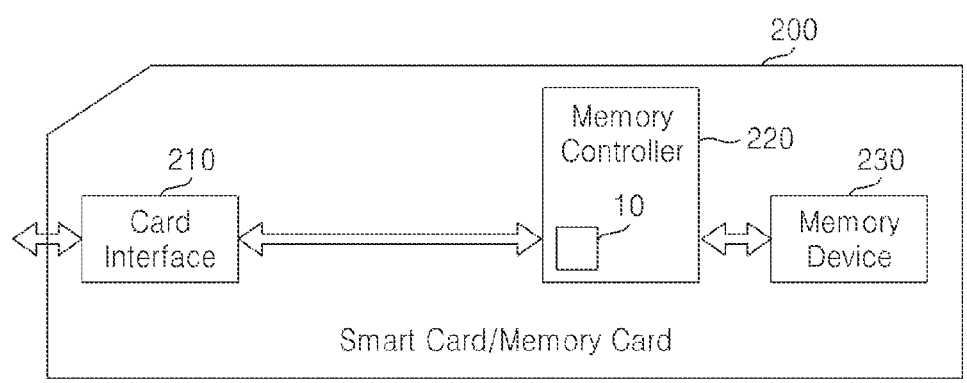
FIG. 12 illustrates a data processing system including a data compression device according to another example embodiment of inventive concepts.

FIG. 12 illustrates a data processing system according to an example embodiment. The data processing system shown in FIG. 12 includes the data compression device 10A, 10B, 10C, 10D, or 1310 of FIG. 1A, 2, 4, 5, or 13.

Referring to FIG. 12, the data processing system (or the data processing apparatus) 200 may be embodied by a smart card, a memory card or the like. As shown in FIG. 12, the data processing system 200 includes a card interface 210, a memory controller 220, and a non-volatile memory device 230.

The memory controller 220 includes the data compression device 10, which represents one or more of the data compression devices 10A, 10B, 10C, 10D, and 1310. In at least some example embodiments, the data compression device 10 may be arranged external to the memory controller 220.

The card interface 210 controls exchange of data between the memory controller 220 and the host (not shown). The memory controller 220 controls the operation of the non-volatile memory device 230, for example, a program operation, a read operation, and/or an erase operation.

While data DATA that is output from the host and input through the card interface 210 is transmitted to the input buffer 30, the data compression device 10 analyzes a pattern of the data DATA. Based on this analysis, the data compression device 10 selectively compresses the buffered data BDi and outputs the buffered data BDi or the compressed data CDATA to the non-volatile memory device 230.

As described above, according to at least some example embodiments, while data is transmitted to the input buffer, a pattern of the data is analyzed and whether to compress the data is determined according to a result of the analysis so that the data compression time may be reduced.

Example embodiments are discussed herein with regard to reference values. These reference values may be design parameters determined based on empirical study and/or data.

While inventive concepts have been particularly shown and described with reference to some example embodiments thereof, it will be understood that various changes in form and details may be made therein without departing from the spirit and scope of the following claims.

What is claimed is:

1. A data compression device comprising:
 a data pattern analyzer configured to analyze data transmitted to an input buffer, the data pattern analyzer being further configured to generate an analysis code based on the analysis of the data; and
 a data compression manager configured to selectively compress the data in the input buffer based on the analysis code; wherein
  the data pattern analyzer is configured to analyze an indication bit included in a header of the data, and to generate the analysis code based on the analysis of the indication bit, the indication bit indicating whether to compress the data.

2. The data compression device of claim 1, wherein the data pattern analyzer comprises:
 a header analyzer configured to output a control signal based on the indication bit included in the header of the data; and
 an estimator configured to be enabled in response to the control signal, the estimator being further configured to count a frequency of each of a plurality of symbols included in the data, assign a codeword to each of the plurality of symbols, and generate the analysis code based on a result of a comparison between a size of a reference data and an estimated size of the data if compressed, the estimated size being calculated based on the frequency of each of the plurality of symbols and a number of bits of the codeword assigned to each of the plurality of symbols.

3. The data compression device of claim 1, wherein the data compression manager comprises:
 a memory configured to store the analysis code;
 a processor configured to compress the data in the input buffer and output compressed data; and
 a selector configured to output the data in the input buffer to one of a non-volatile memory device and the processor based on the analysis code stored in the memory.

4. The data compression device of claim 3, wherein the processor sequentially compresses respective symbols of the data in the input buffer and outputs information indicative of a relationship between the symbols without compressing duplicated symbols within the data.

5. A data processing apparatus comprising:
 a non-volatile memory device; and
 the data compression device of claim 1 configured to selectively compress the data, the data compression device further including,
  the input buffer configured to buffer the data, and wherein
  the data pattern analyzer is further configured to at least one of analyze the data and generate the analysis code while the data is transmitted to the input buffer.

6. The data processing apparatus of claim 5, wherein the data compression manager comprises:
 a memory configured to store the analysis code;

a processor configured to compress the buffered data and output the compressed data; and a selector configured to output the buffered data to one of the non-volatile memory device and the processor based on the analysis code stored in the memory.

7. The data processing apparatus of claim 5, wherein the data processing apparatus is one of a solid state drive (SSD), a smart card, a memory card, a smart phone and a tablet personal computer (PC).

8. The data processing apparatus of claim 5, wherein the data compression device is integrated in a memory controller configured to control the non-volatile memory device.

9. A data compression device comprising:
a data pattern analyzer configured to analyze data transmitted to an input buffer, the data pattern analyzer being further configured to generate an analysis code based on the analysis of the data; and
a data compression manager configured to selectively compress the data in the input buffer based on the analysis code; wherein
the data pattern analyzer is configured to count a frequency of each of a plurality of symbols included in the data, and to generate the analysis code based on a result of a comparison between a reference value and only a maximum or a minimum of the counted frequencies.

10. A data processing apparatus comprising:
a non-volatile memory device; and
the data compression device of claim 9 configured to selectively compress the data, the data compression device further including,
the input buffer configured to buffer the data.

11. A data compression device comprising:
a data pattern analyzer configured to analyze data transmitted to an input buffer, the data pattern analyzer being further configured to generate an analysis code based on the analysis of the data; and
a data compression manager configured to selectively compress the data in the input buffer based on the analysis code; wherein
the data pattern analyzer is configured to count a frequency of each of a plurality of symbols included in the data, assign a codeword to each of the plurality of symbols, and generate the analysis code based on a result of a comparison between a size of a reference data and an estimated size of the data if compressed, the estimated size being calculated based on the counted frequency of each of the plurality of symbols and a number of bits of the codeword assigned to each of the plurality of symbols.

12. The data compression device of claim 11, wherein the data pattern analyzer comprises:
a pattern analyzer configured to count the frequency of each of the plurality of symbols included in the data, and assign the codeword to each of the plurality of symbols; and
an estimator configured to receive the frequency of each of the plurality of symbols and the codeword assigned to each of the plurality of symbols from the pattern analyzer, the estimator being further configured to generate the analysis code based on the result of the comparison between the size of the reference data and the estimated size of the data if compressed.

13. A data processing apparatus comprising:
a non-volatile memory device; and
the data compression device of claim 11 configured to selectively compress the data, the data compression device further including,
the input buffer configured to buffer the data.

14. A data compression device comprising:
a data compression manager configured to selectively compress data based on one of analysis of a pattern of the data and a value of an indication bit included in a header of the data, each of the pattern and the indication bit being indicative of whether the data is compressed data; wherein
the analysis of the pattern of the data includes one of,
comparing a reference value with only a maximum or a minimum frequency from among counted frequencies of each symbol included in the data, and
comparing a size of reference data with an estimated size of the data if compressed, the estimated size being calculated based on counted frequencies of each of the plurality of symbols included in the data and a number of bits of a codeword assigned to each of the plurality of symbols.

15. The device of claim 14, further comprising:
a data pattern analyzer configured to determine whether the data includes header information; and wherein
the data compression manager selectively compresses the data based on the indication bit if the data includes header information.

16. The device of claim 15, wherein the data compression manager selectively compresses the data based on analysis of the pattern of the data if the data does not include header information.

17. The device of claim 16, wherein the data pattern analyzer is further configured to count the frequency of each symbol included in the data, and compare the reference value with only the maximum or the minimum frequency from among the counted frequencies of each symbol, and wherein the data compression manager selectively compresses the data based on the comparison.

18. The device of claim 16, wherein the data pattern analyzer is further configured to count the frequency of each symbol included in the data, assign the codeword to each of the symbols included in the data, estimate the size of the data if compressed based on the frequencies and the number of bits of each assigned codeword, and compare the estimated size with the size of the reference data, wherein the data compression manager selectively compresses the data based on the comparison between the estimated size and the size of the reference data.

* * * * *